United States Patent [19]

Ziegler

[11] Patent Number: 4,591,410

[45] Date of Patent: May 27, 1986

[54] METHOD FOR THE PRODUCTION OF MONOCRYSTALLINE $HG_{1-x}CD_xTE$

[75] Inventor: Johann Ziegler, Heilbronn, Fed. Rep. of Germany

[73] Assignee: Telefunken electronic GmbH, Heilbronn, Fed. Rep. of Germany

[21] Appl. No.: 623,132

[22] Filed: Jun. 19, 1984

[30] Foreign Application Priority Data

Jun. 24, 1983 [DE] Fed. Rep. of Germany ....... 3322789

[51] Int. Cl.$^4$ .......................... C30B 1/06; C30B 29/46
[52] U.S. Cl. ............................. 156/616 R; 156/617 V; 156/DIG. 72; 156/DIG. 82; 156/DIG. 83
[58] Field of Search ............ 156/603, 616 R, DIG. 72, 156/DIG. 82, 617 V, DIG. 73, DIG. 83; 75/65 ZM; 420/525, 526, 579, 590; 422/248; 252/62.3 ZT

[56] References Cited

U.S. PATENT DOCUMENTS

| | | | |
|---|---|---|---|
| 1,793,672 | 2/1931 | Bridgman | 156/616 R |
| 3,622,399 | 11/1971 | Johnson | 156/603 |
| 3,849,205 | 11/1974 | Brau et al. | 156/603 |

FOREIGN PATENT DOCUMENTS 2315162  10/1974  Fed. Rep. of Germany.

OTHER PUBLICATIONS

*Semiconductors and Semimetals,* vol. 18, 1981, edited by Willardson et al., pp. 63–70.

*Primary Examiner*—Barry S. Richman
*Assistant Examiner*—Michael S. Gzybowski
*Attorney, Agent, or Firm*—Spencer & Frank

[57] ABSTRACT

A process for the production of monocrystalline $Hg_{1-x}Cd_xTe$ wherein a molten mass of the desired composition x is cooled and solidified in a closed vessel and the solidified crystal is converted at temperatures below its melting point by high temperature recrystallization into the monocrystalline state, with an ampule of conical longitudinal cross-section being used as the closed vessel and the ampule being so held during the solidifying of the molten mass that the molten mass extends from the ample tip into the interior of the ampule. Undesired pressure is prevented from being exerted on the crystal by the ampule wall by the crystal only partially filling out the ampule interior and being conveyed into the ampule area of larger cross-section, and the recrystallization process is performed in a temperature zone with a longitudinal temperature gradient with the temperature decreasing in the direction of the larger ampule cross-section.

18 Claims, 2 Drawing Figures

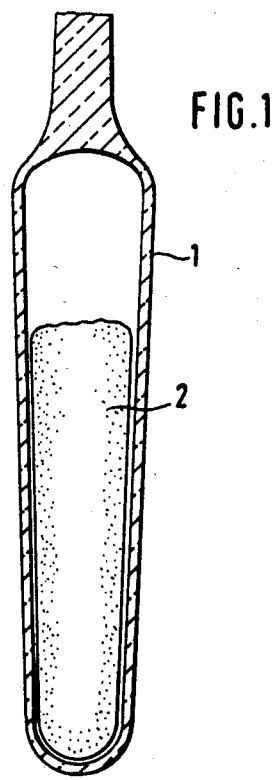
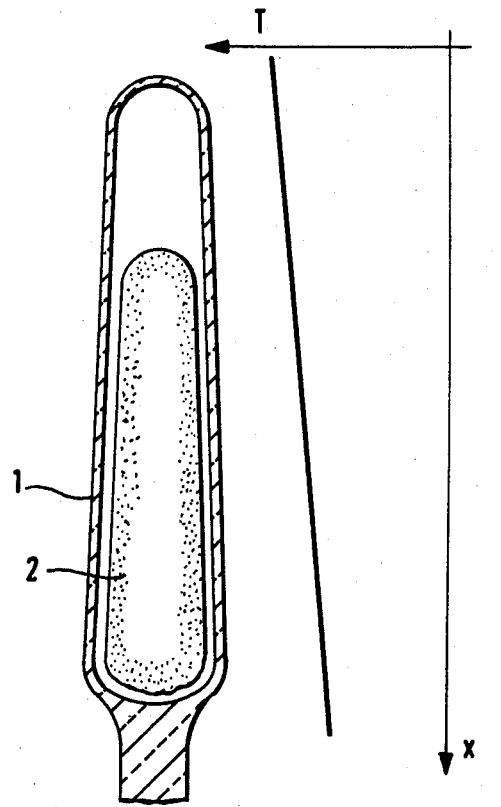

METHOD FOR THE PRODUCTION OF MONOCRYSTALLINE $Hg_{1-x}Cd_xTe$

BACKGROUND OF THE INVENTION

The invention relates to a process for the production of monocrystalline $Hg_{1-x}Cd_xTe$, wherein a molten mass of the desired composition is cooled and solidified in a closed vessel, and the solidified crystal is converted, at temperatures below its melting point, by high temperature recrystallization into the monocrystalline state.

Preferably the pseudobinary compound $Hg_{1-x}Cd_xTe$ is used as material for highly sensitive infrared detectors, and, in particular, preferably for the wavelength range of the so-called second and third atmospheric windows (3–5 $\mu$m wavelength, $x=0.3$, and 8–12 $\mu$m wavelength, $x=0.2$, respectively; $x=$mole fraction of CdTe), both photoconducting detectors (photoresistors) and photovoltaic detectors (photodiodes) are used.

The compound $Hg_{1-x}Cd_xTe$ exhibits a continuous miscibility between the semimetal HgTe ($x=0$) and the semiconductor compound CdTe ($x=1$) so that by selection of x, a band gap between 0.3 eV and 1.6 eV can be set. The relevant composition for the infrared spectral region lies in the order of magnitude of $0.15<x<1.0$.

For high resolution infrared detectors, a monocrystalline material with as few crystalline defects as possible is essential. Crystal defects are, for example, dislocations, accumulations of dislocations, small angle grain boundaries and common grain boundaries. Crystal defects decrease the lifetime of the minority carriers by formation of recombination centres and cause additional noise. Both effects result in a decrease in the spectral detectivity, which provides an indication of the resolution of the infrared detector.

In the manufacture of $Hg_{1-x}Cd_xTe$ be volume crystal growth, it is preferable to use crystal growing processes wherein the homogeneous molten mass of the desired composition is directionally cooled at relatively high crystallization speeds in order to suppress a segregation of the molten mass during the rapid cooling process. The synthesis and subsequent rapid cooling process are generally carried out in closed cylindrical quartz glass ampules since the relatively high mercury partial pressure in the molten mass in an open system would result in an inadmissible loss of mercury.

The crystal existing after the cooling is polycrystalline with areas rich in CdTe and HgTe within the grains (so-called dendrites) and a high dislocation density. The conversion of the crystal into the necessary monocrystalline state generally takes place by way of high temperature recrystallization in the solid state at temperatures slightly below the solidus temperature so as to avoid melting of the crystal and consequent material segregation. With this process, the composition differences within the grains are balanced by interdiffusion instead of by simultaneous grain boundary growth of individual grains. As a rule, the recrystallization is performed in the cylindrical ampule used for the synthesis with temperature constancy prevailing between the crystal tip and the crystal end.

SUMMARY OF THE INVENTION

The object of the invention is to indicate a process for the production of monocrystalline $Hg_{1-x}Cd_xTe$ which provides a monocrystal with as few crystal defects as possible.

According to the invention, there is provided a method for the production of monocrystalline $Hg_{1-x}Cd_xTe$, wherein a molten mass of the desired composition is cooled and solidified in a closed vessel and the solidified crystal is converted at temperatures below its melting point by high temperature recrystallization into the monocrystalline state, an ampule with a cone-shaped longitudinal cross-section is used as the closed vessel, the ampule is not completely filled with the molten mass, the ampule is held during solidification of the molten mass in such a way that the molten mass extends from the ampule tip into the interior of the ampule, an undesired pressure on the crystal is avoided by the ampule wall in that the crystal, which only partially fills out the ampule interior, is conveyed into the ampule area of larger cross-section prior to recrystallization, and the recrystallization process is performed in a temperature zone with a longitudinal temperature gradient with the temperature decreasing in the direction of the larger ampule cross-section.

The crystal is conveyed to the ampule area of larger cross-section by, for example, turning the ampule, after the cooling, about its transverse axis so that the crystal slides into the ampule area of larger cross-section.

The invention prevents compression, and the resulting increased crystal defect density in the form of small angle grain boundaries and dislocations, from being induced in the crystal by the ampule wall contiguous to the crystal, during the recrystallization in the synthesis ampule. With the known process, the compression may be caused in the crystal by a small gap of, for example, 0.015 mm developing between the crystal and the ampule wall, after the cooling, on account of the different thermal expansion coefficients of $SiO_2$ and $Hg_{1-x}Cd_xTe$. In the known process, due to this gap and the way in which the ampule must be handled prior to the recrystallization, the movable crystal changes its position relative to the ampule. Owing to the unavoidable surface waviness of the quartz glass inside wall of $>0.015$ mm, the distance between the crystal and the ampule wall decreases, in the worst case the crystal gets jammed, with the different thermal expansion coefficients between the crystal and the quartz glass causing the unwanted compression in the crystal. This compression does not occur if the ampule is of conical configuration, in accordance with the invention, and the crystal is conveyed into the ampule area of larger cross-section after it has been produced (after the molten mass has cooled down).

During the solidifying process when the molten mass is cooling down, crystallites which grow with precedence over others form in the developing crystal, independently of their orientation. If the recrystallization process for production of the crystal is performed within a homogeneous temperature profile, and not, as in the invention, within a temperature gradient, each grain along the entire length of the crystal is subjected to the same thermal energy which acts as a driving force for a grain boundary growth. During the recrystallization process in a homogeneous temperature zone, grain boundary migration of individual crystallites therefore results in a competitive crystal growth, which is not the case if the recrystallization process is performed, in accordance with the invention, in a temperature zone with a suitable temperature gradient.

In the process according to the invention, an ampule which is cone-shaped in the direction of the longitudinal axis is used as the synthesis ampule. The ampule preferably consists of quartz glass. The crystallization of the molten mass by rapid directional cooling occurs from the tip to the end of the conical ampule, i.e., from the narrower ampule area to the wider ampule area. After the rapid cooling, the crystal does not completely fill the ampule in the longitudinal direction. By turning the ampule, after the rapid cooling, 180° about the transverse axis, the movable crystal slides into the ampule area of larger cross-section. There is, consequently, a sufficiently large space between the crystal and the ampule wall for induced compression in the crystal, and the resulting crystal defects, to be avoided.

In the process according to the invention, the recrystallization process is performed under a longitudinal temperature gradient, with the temperature decreasing from the first solidified crystal tip to the last solidified crystal end. Due to the higher temperature at the crystal tip, the crystal is supplied with a directionally and locally dependent thermal energy which acts as the driving force for a grain boundary growth. A preferred recrystallization direction is superimposed on the solidifying direction, in the same direction. The dominant grains which form during the longitudinal crystallization (increasing in size in the course of the solidifying process) are furthered by the superimposed temperature gradient in such a way that they preferably undergo a grain boundary migration, to the disadvantage of the other grains. With the process according to the invention, there is no competitive grain boundary growth between individual grains and, therefore, after an appropriate recrystallization time, migration of the grain boundaries of preferred crystallites to the crystal edge results in a monocrystal.

BRIEF DESCRIPTION OF THE DRAWINGS

The invention will now be described in greater detail, by way of examples, with reference to the drawings, in which:

FIG. 1 shows the solidifying of the molten mass; and
FIG 2. shows the turning of the ampule

DESCRIPTION OF THE PREFERRED EMBODIMENTS

As shown in FIG. 1, a homogeneous molten mass 2 comprised of the three starting substances Hg, Cd and Te in their desired composition x is produced in accordance with conventional methods, in a conical, evacuated synthesis ampule 1 made of quartz glass. In the case of, for example, a desired composition with $x=0.2$, the inside diameter of the ampule 1 is 10 mm at the tip and 12 mm at the ampule end, with the length being 90 mm and the wall thickness 2 mm. By rapid directional cooling of the molten mass in the longitudinal direction of the ampule, a crystal having the desired composition x substantially throughout its entire length and diameter is formed. Following the rapid cooling, the crystal is polycrystalline, i.e., it is comprised of a plurality of individual crystallites. In the crystal tip area, the crystallites are greater in number than at the other crystal end. Owing to the formation of crystallites which grow with precedence over others during the solidifying process, the number of grains in the longitudinal direction of the crystal decreases, and the grains which grow with precedence over others simultaneously increase in size. The ampule volume in the longitudinal direction is not completely filled by the crystal material, with the free volume not filled by the crystal being, for example, 30%.

After the crystal cools down to room temperature, the quartz glass ampule 1 is turned 180° about the transverse axis, as shown in FIG. 2, to enable the crystal 2 to slide into the ampule area of larger cross-section. As is apparent from FIG. 2, this has the advantage that the crystal 2 is adequately spaced from the ampule wall and is, therefore, not contiguous to it.

The gist of the invention is that an ampule of conical cross-section along the longitudinal axis is used. The molten mass is not allowed to fill out the entire inside area of the ampule. It must, furthermore, be ensured that the molten mass solidifies from the tip of the ampule in its longitudinal direction. After solidifying, the crystal must be conveyed into the area of the ampule having the larger cross-section so as to prevent undesired pressure from being exerted on the crystal by the ampule wall during the later recrystallization process.

The ampule/crystal unit is placed in the described position in a furnace whose temperature profile is such that the ampule is located in a temperature gradient in which the temperature decreases from the tip of the crystal to the end of the crystal. To this end, the ampule is fixed in a furnace with a suitable temperature profile, e.g., in a resistance heated 3-zone tube furnace, and the temperature is increased at a certain heating rate, e.g., 100° C./h. When the maximum temperature is reached, the temperature of the tip of the crystal is slightly beneath the solidus temperature of the crystal, e.g., 670° C. for a crystal composition of $x=0.2$. The temperature decreases linearly in the longitudinal direction of the crystal, the temperature gradient is, e.g., 4° C./cm. During the recrystallization time of, e.g., 20–25 days, the temperature gradient is kept constant. After termination of the recrystallization, the ampule is cooled down in air or brought down to room temperature at a certain cooling rate, e.g., 50° C./h.

As experiments have proven, monocrystalline $Hg_{1-x}Cd_xTe$ may be produced using the process according to the invention without small angle grain boundaries which in the known process are induced in the crystal by external stress. Also, with the process according to the invention, the dislocation density in the crystal is substantially decreased. Owing to the decrease in the aforementioned crystal defects, which act as generation and recombination centres, the minority carrier lifetime in $Hg_{1-x}Cd_xTe$ crystals was able to be increased and the noise decreased with the aid of the invention. This results in a substantial increase in the spectral detectivity $D\lambda$ for photoconducting and photovoltaic detectors, which is a direct indication of the quality of the detectors.

What is claimed is:

1. A method for the production of monocrystalline $Hg_{1-x}Cd_xTe$, including the steps of cooling and solidifying a molten mass of a desired composition of $Hg_{1-x}Cd_xTe$ in a closed ampule, and thereafter converting the solidified crystal in the ampule at temperatures below the melting point of the crystal by high temperature recrystallization into the monocrystalline state; and wherein said ampule is of conical longitudinal cross-section having a tip portion, the ampule is not completely filled with the molten mass, the ampule is held during the solidifying of the molten mass such that the molten mass extends from the ampule tip into the interior of the ampule, an undesired pressure is prevented from being exerted on the crystal by the ampule wall during recrystallization by conveying the crystal, which only partially fills the ampule interior, into an ampule area of larger cross-section prior to said step of converting, and the recrystallization process is performed in a temperature zone with a longitudinal temperature gradient that decreases in the direction of increasing ampule cross-section.

2. The method according to claim 1, wherein the ampule is made of quartz glass.

3. The method according to claim 1, wherein the diameter of the ampule increases in the longitudinal direction by 2.5% per cm.

4. The method according to claim 1, wherein the recrystallization time is 20 to 25 days.

5. The method according to claim 1, wherein said temperature gradient extends in the direction of solidification, and the temperature decreases as the distance from the ampule tip increases.

6. The method as defined in claim 1 wherein the ampule containing said crystal is maintained stationary in said temperature gradient during said recrystallization process.

7. The method as defined in claim 1 wherein the ampule is maintained in a vertical position with the ampule tip facing downward during said step of cooling and facing upward during said step of converting.

8. The method as defined in claim 1 wherein said temperature gradient is 4° C./cm.

9. The method according to claim 1, wherein said step of conveying includes turning the ampule, after said step of cooling, about its transverse axis so that the crystal slides into the ampule area of larger cross-section.

10. The method according to claim 9, wherein the ampule is turned approximately 180° about its transverse axis.

11. A method for the production of monocrystalline $Hg_{1-x}Cd_xTe$ comprising the steps of:
  providing a closed ampule of conical longitudinal cross-section which is partially filled with a molten mass of a desired composition of $Hg_{1-x}Cd_xTe$;
  cooling and solidifying the molten mass while maintaining the ampule in a position such that the molten mass extends from a tip portion of the ampule into the interior of the ampule;
  after cooling and solidifying, moving the ampule so as to cause the solidified crystal, which does not fill the ampule, to move from the tip portion into an ampule portion of larger cross-section; and
  thereafter converting the solidified crystal into the monocrystalline state by a high temperature recrystallization process utilizing temperatures below the melting point of said crystal, said recrystallization process including positioning the ampule with the crystal in the ampule portion of larger cross-section in a temperature zone having a longitudinal temperature gradient which decreases in a direction toward the larger ampule cross-section and which has a maximum temperature adjacent said crystal which is below the crystal melting point, and maintaining said temperature gradient throughout said crystal for a time sufficient to produce recrystallization.

12. The method as defined in claim 11 wherein: said ampule is disposed in a substantially vertical position during said steps of cooling and converting; and said step of moving comprises turning the ampule about its transverse axis so that the crystal slides from the tip portion and into the ampule portion of larger cross-section.

13. The method as defined in claim 12 wherein the ampule is turned by approximately 180° about its transverse axis.

14. The method as defined in claim 11 wherein said step of cooling and solidifying is carried out such that the molten mass is solidified in a longitudinal direction starting with the molten mass in the tip portion of the ampule, whereby the highest temperature of said temperature gradient in said zone is at the tip portion of said solidified crystal.

15. The method as defined in claim 14 wherein said highest temperature is slightly below the solidus temperature of said crystal.

16. The method as defined in claim 15 wherein said time for recrystallization is approximately 20–25 days.

17. The method as defined in claim 15 wherein said temperature gradient is a linear temperature gradient.

18. The method as defined in claim 17 wherein said temperature gradient is approximately 4° C./cm.

* * * * *